United States Patent [19]

Inoue

[11] Patent Number: 5,561,301
[45] Date of Patent: Oct. 1, 1996

[54] OPTO-SEMICONDUCTOR DEVICE WITH PIEZOELECTRIC

[75] Inventor: Tadao Inoue, Kawasaki, Japan

[73] Assignee: Fujitsu Limited, Kanagawa, Japan

[21] Appl. No.: 377,602

[22] Filed: Jan. 25, 1995

[30] Foreign Application Priority Data

Feb. 21, 1994 [JP] Japan .................................. 6-022602

[51] Int. Cl.$^6$ ...................... H01L 29/06; H01L 31/0328; H01L 31/0336
[52] U.S. Cl. ................................ 257/13; 257/17; 257/18; 257/22; 257/21; 372/45; 372/46; 359/248
[58] Field of Search ................................ 257/18, 19, 17, 257/22, 21, 13, 200; 372/45, 46; 359/248

[56] References Cited

U.S. PATENT DOCUMENTS

| | | | |
|---|---|---|---|
| 4,106,028 | 8/1978 | Jeffers et al. | 360/55 X |
| 4,952,792 | 8/1990 | Caridi | 257/18 X |
| 5,012,304 | 4/1991 | Kash | 257/18 |
| 5,296,721 | 3/1994 | Schulman et al. | 257/18 X |
| 5,313,073 | 5/1994 | Kuroda et al. | 257/18 |

FOREIGN PATENT DOCUMENTS

| | | |
|---|---|---|
| 6-151810 | 5/1931 | Japan . |
| 4306894 | 10/1992 | Japan . |

OTHER PUBLICATIONS

Gershoni et al, "Strained–Layer $Ga_{1-y}In_yAs/InP$ Avalanche Photodetectors," *Appl Phys. Lett.* 53 (14), 3 Oct. 1988, pp. 1294–1296.

Osbourn et al, "A $GaAs_xP_{1-x}/GaP$ Strained–Layer Superlattice," *Appl. Phys. Lett.* 41(2), 15 Jul. 1982, pp. 172–174.

Primary Examiner—William Mintel
Attorney, Agent, or Firm—Armstrong, Westerman, Hattori, McLeland & Naughton

[57] ABSTRACT

An opto-semiconductor device is disclosed which is provided with a quantum well structure comprising a first and a second barrier layer and a well layer sandwiched by the barrier layers. The barrier layers are provided in at least part thereof with a strain layer enabled to generate an internal electric field by a piezoelectric effect. The barrier layers are adapted to sandwich the well layers.

17 Claims, 9 Drawing Sheets

{111} A plane substrate

{111} B plane substrate

FIG.6A
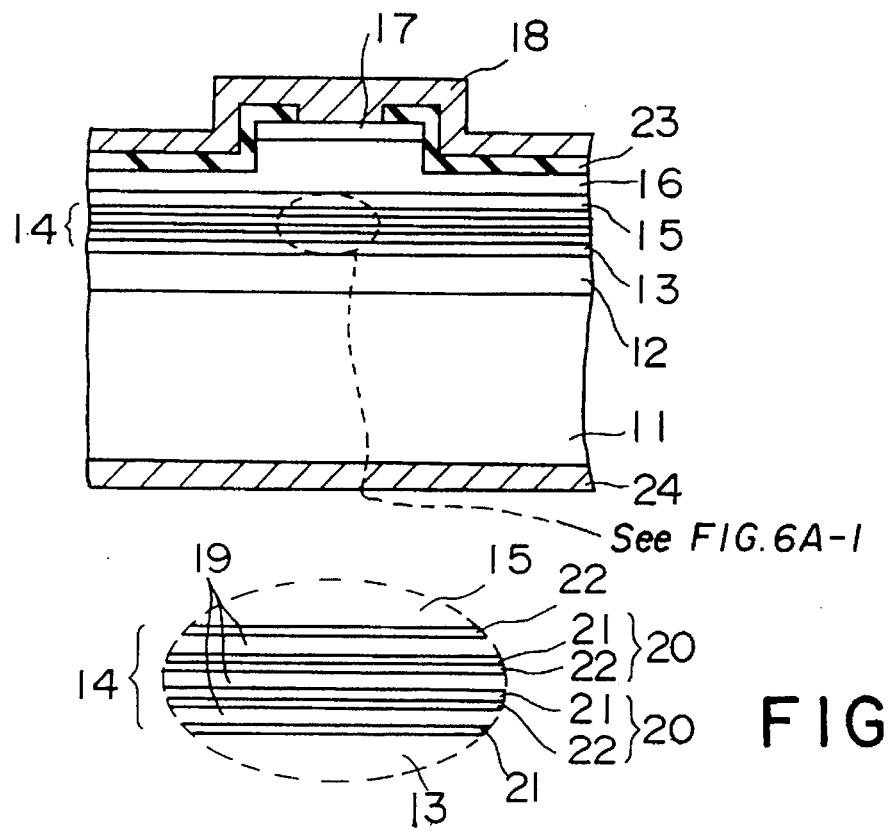
FIG.6A-1
FIG.6B
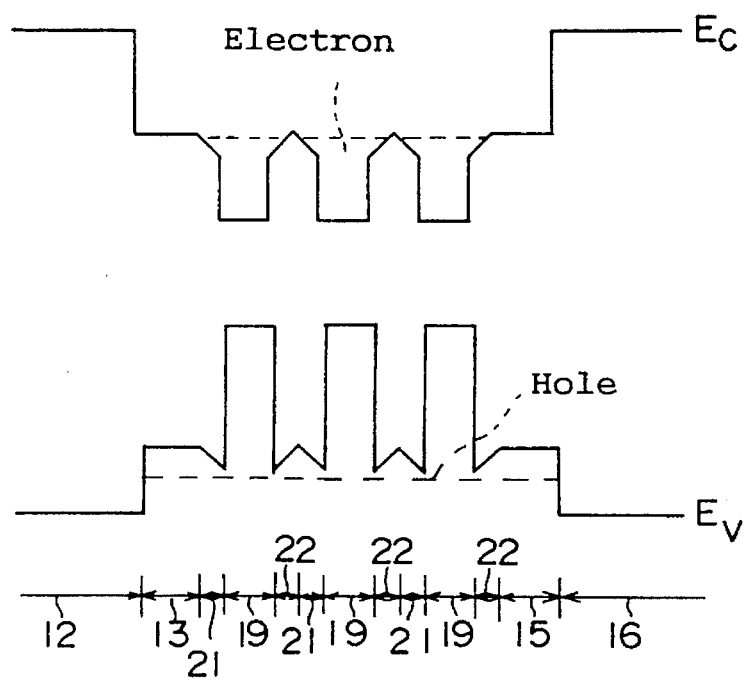
FIG.6B-1

FIG. 7A
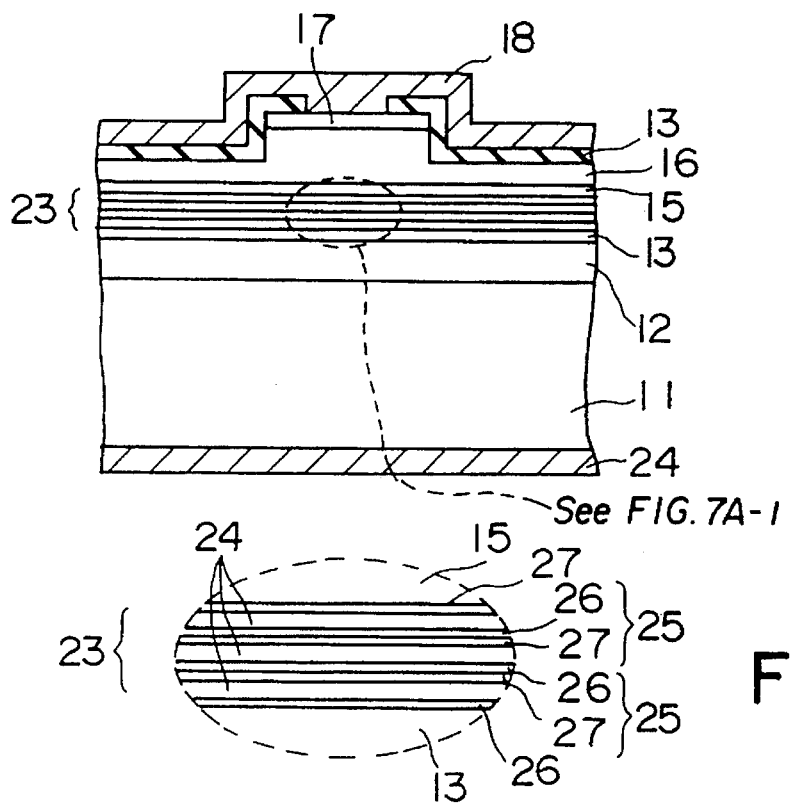
FIG. 7A-1
FIG. 7B
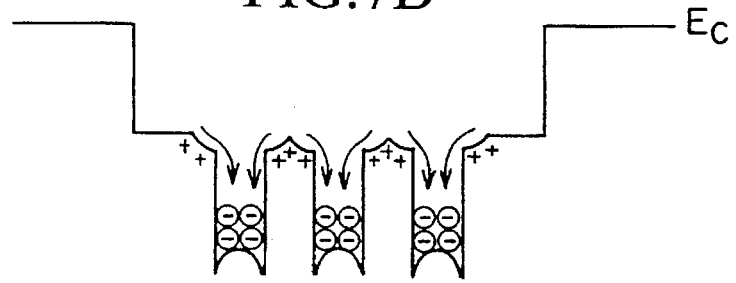
FIG. 7B-1
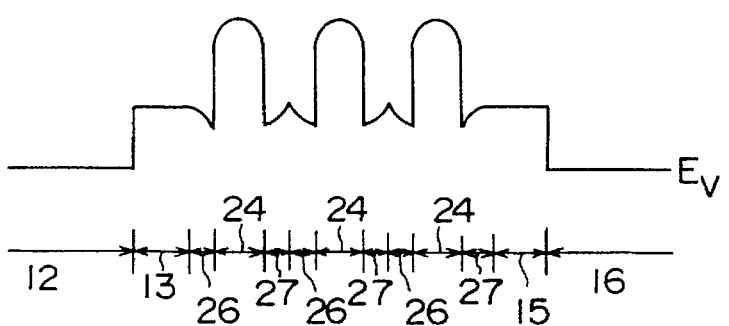

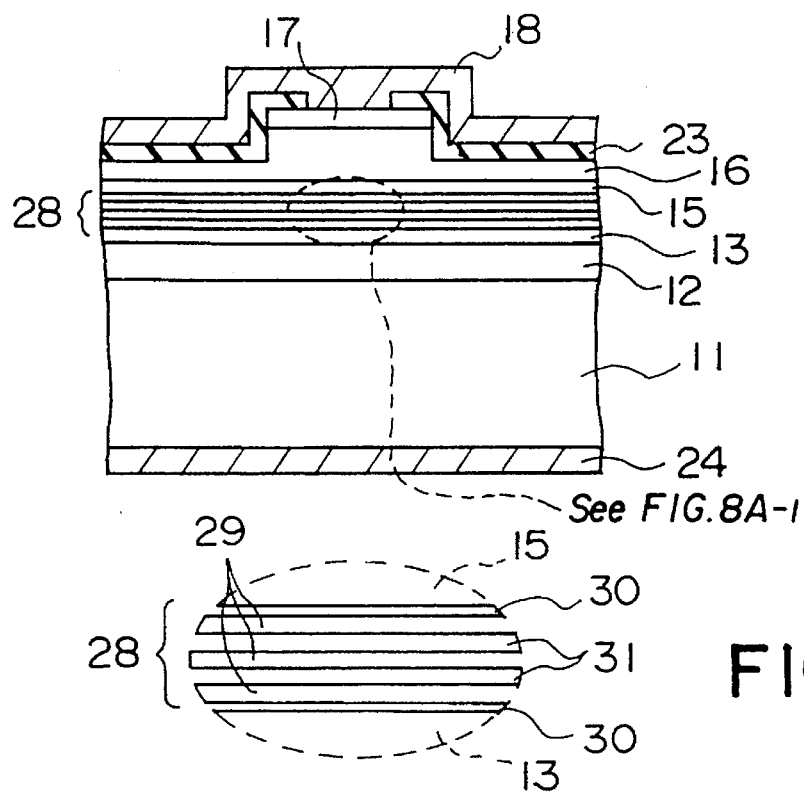
FIG. 8A
FIG. 8A-1
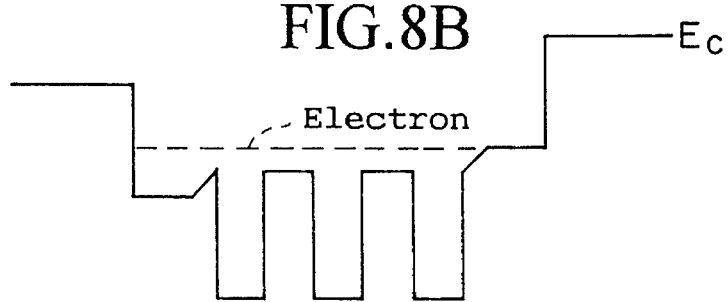
FIG. 8B
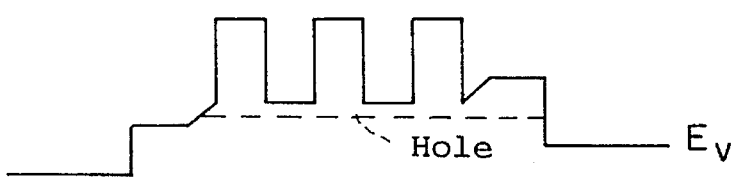
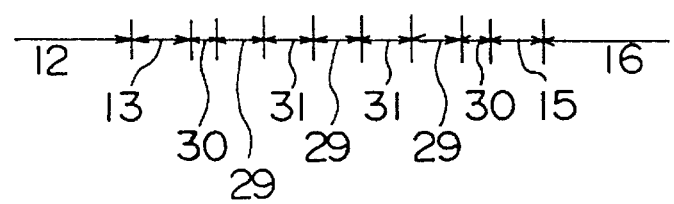
FIG. 8B-1

FIG.9A
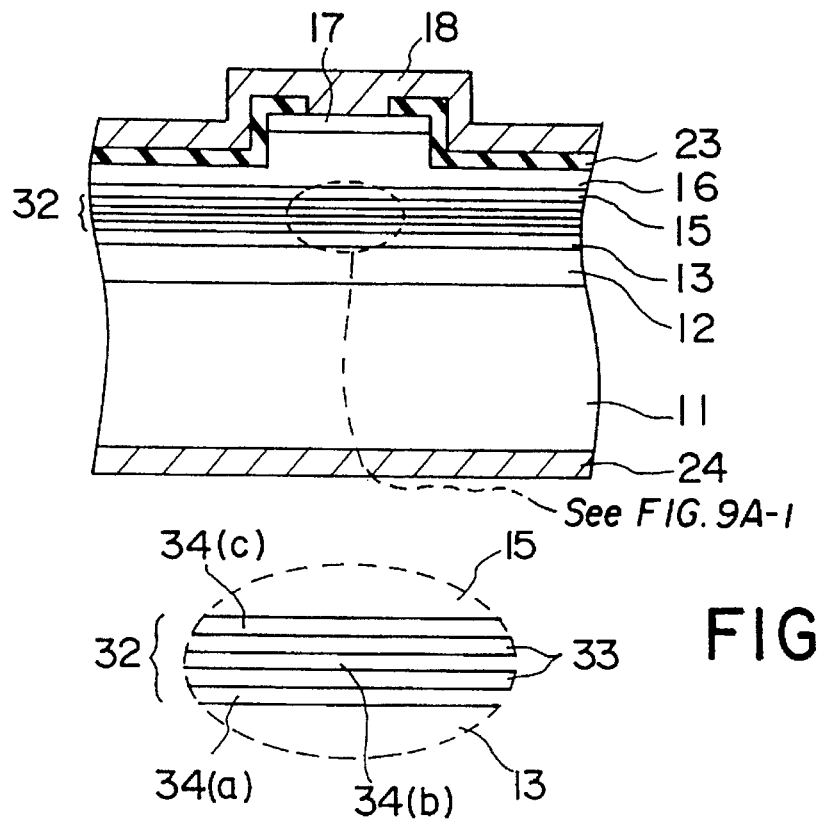
FIG.9A-1
FIG.9B
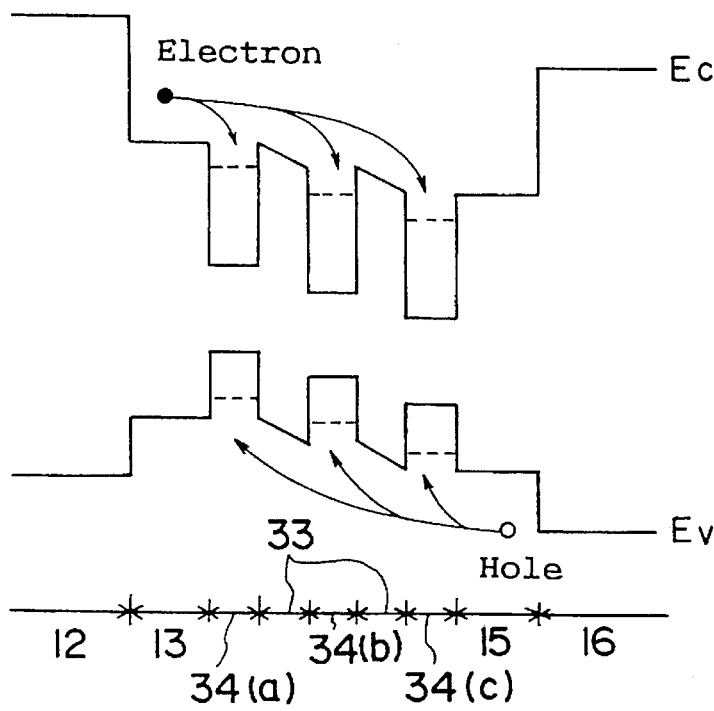
FIG.9B-1

OPTO-SEMICONDUCTOR DEVICE WITH PIEZOELECTRIC

BACKGROUND OF THE INVENTION

1. Field of the Invention

This invention relates to an opto-semiconductor device and more particularly to such opto-semiconductor devices as a semiconductor laser, light modulator, light switch, and light filter which are possessed of a quantum well structure.

2. Description of the Related Art

The opto-semiconductor devices are used in optical transmission systems and optical information systems. Recently, particularly for improving various properties of these systems, structures using a quantum well active layer have been studied and developed.

The semiconductor laser of the quantum well structure, for example, has an active layer of a quantum well layer structure exhibiting a small band gap and a large refractive index interposed between first and second cladding layers exhibiting a large energy band gap and a small refractive index. In this case, the quantum well layer has a thickness substantially equal to the de Broglie wavelength. With this thickness, however, it inevitably exhibits an unduly small light confinement coefficient and an unduly large threshold current concentration.

For the purpose of correcting the defect, the separate confinement heterostructure (SCH) quantum well structure which has interposed between a clad layer and a quantum well layer an SCH layer exhibiting a band gap and a refractive index which are both intermediates of those exhibited by the two outer layers is adopted.

The active layer is not limited to a single quantum well layer. At times, a multilayer quantum well structure which has a plurality of quantum well layers superposed as divided by separate barrier layers is adopted instead.

The material of which the SCH layers superposed on the opposite sides of each quantum well layer are formed or the material of which the separate barrier layer interposed between two adjacent quantum well layers is formed may be similar in general composition to and different in atomic percentage composition from the material of the well layer in some cases or may be totally different from the material of the well layer in other cases. Since the SCH layers and the separate barrier layers both function to confine carriers within the well layers, they may be occasionally referred to by a general term of a barrier layer.

FIGS. 1A to 1C illustrate energy band structures of prior art semiconductor lasers.

At the stage shown in FIG. 1A, SCH layers 104 and 105 are interposed between two cladding layers 101 and 102 as separated by an intervening active layer 103 of multilayer quantum well structure. As concrete examples of the materials used for these component layers, InP for the cladding layers 101 and 102, $In_xGa_{1-x}As_yP_{1-y}$ for the SCH layers 104 and 105, InGaAs for each well layer 103a, and $In_xGa_{1-x}As_yP_{1-y}$ for each barrier layer 103b may be cited. Optionally, the multilayer quantum well structure may be subjected to modulation doping. The modulation doping is implemented by a procedure which comprises doping the barrier layers with an n type or a p type impurity while precluding the well layers from being doped with the same impurity. In consequence of the modulation doping, at least part of the carriers excited from the impurity in a barrier layer 103c fall into a well layer 103d as shown in FIG. 2 and carriers inevitably enter the well copiously even in the absence of the injection of an electric current into the semiconductor laser. Thus, the desire to decrease the emissive oscillation threshold current and increase the modulation speed can be satisfied.

Incidentally, the quantum well structure, when using a material which has a small band offset on the conduction band side, entails the problem that the electrons injected from an external source for the sake of laser oscillation tend to overflow from the well layers 103a as shown in FIG. 1B to the extent of degrading the efficiency of the injection. When a material having a small band offset on the valence band side is used instead, the positive holes injected from an external source tend to overflow from the well layers 103a to the extent of degrading the efficiency of the injection.

In the multilayer quantum well structure in the state of laser oscillation, the carriers supplied from an external source tend to be injected in a decreased amount into the well layers 103a or 103b located forward in the direction of movement of the carriers as shown in FIG. 1C. This phenomenon gains markedly in proportion as the number of wells increases.

In the quantum well structure shown in FIG. 2 which has undergone modulation doping, the carriers excited from the impurity existing in the areas of the barrier layers 103c close to the well layers 103d fall into the well layers 103d and get confined therein to give rise to space charge. In this case, the energy band ends of the well layers 103d are caused to assume a radius of curvature under the influence of the space charge and consequently the energy band ends of the barrier layer 103c are compelled to assume a correspondingly concaved center. When the barrier layers 103c have an unduly large thickness, therefore, the carriers excited from the impurity existing at the centers thereof are not easily allowed to fall into the wells and the effect of the modulation doping is not amply utilized.

SUMMARY OF THE INVENTION

This invention has been produced for the purpose of solving the problems confronting the conventional devices as mentioned above.

Therefore, an objective of the present invention is to provide an opto-semiconductor device possessed of a quantum well structure, which opto-semiconductor device enables carriers excited from an impurity existing at the centers of barrier layers to be efficiently injected into wells and, at the same time, prevents the carriers admitted in the wells from readily overflowing from the wells.

The opto-semiconductor device which constitutes the first aspect of this invention is possessed of a quantum well structure which comprises barrier layers provided in at least part thereof with a strain layer capable of generating an inner electric field by virtue of a piezoelectric effect and well layers. The strain layer is formed of a crystal of a zincblende structure and is grown on an underlying layer having a {111} plane, for example.

In the opto-semiconductor device which constitutes the second aspect of this invention, the well layers are interposed each between first and second strain layers. The inner electric field in each strain layer is generated in the direction of from the interior to the exterior or in the direction of from the exterior to the interior of each well layer.

In accordance with this invention, the barriers which adjoin the well layers in the quantum well structure have a strain which generates an inner electric field by virtue of a piezoelectric effect.

In this case, when the electric field is generated in the direction of from the interior to the exterior of the well layers on the conduction band side, the well layers are inevitably caused to exist on the lower side of the inclination of potential which is generated by the strain.

The strain layers which generate an electric field owing to a piezoelectric effect have a crystal of the zincblende structure mainly parallel to the {111} plane.

In this structure, the tensile strain barrier layers formed on the {111} A plane (the plane based on a group III or a group II element substrate of a group III–V or a group II–VI compound semiconductor generate therein an electric field in the direction of from the interior of the layer to the substrate and the potential of the tensile strain barrier layers is so inclined as to lose in height in proportion as the distance from the substrate increases. Then, the compressive strain barrier layers which are formed on the {111} A plane substrate generate therein an electric field in the direction opposite to the inner electric field generated in the tensile strain barrier layers. The potential of the compressive strain barrier layers is so inclined as to gain in height in proportion as the distance from the substrate increases.

In contrast, the compressive strain barrier layers which are formed on the {111} B plane substrate based on a group V or a group VI element generate therein an electric field in the direction of from the interior of the layer to the substrate. The potential of these compressive strain barriers is so inclined as to lose in height in proportion as the distance from the substrate increases. Then, the tensile strain barrier layers formed on the {111} B plane substrate generate therein an electric field in the direction opposite to the inner electric field of the compressive strain barrier layers. The potential of these tensile strain barrier layers is so inclined as to gain in height in proportion as the distance from the substrate increases.

By selecting the plane orientation of a substratal semiconductor layer destined to form a quantum well structure and further distorting barrier layers toward either tensile or compressive, therefore, there is obtained a potential such that a well may occur on the bottom of a cleft formed by two adjacent barriers. According to the potential of this type, the wells on the conduction band side have great depth as compared with those in the quantum well structure having no distortion in the barrier layers, with the result that carriers will not readily overflow from the wells and the otherwise possible increase of a threshold current will be repressed.

Then, the potentials of the wells located forward in the direction of movement of carriers can be sequentially decreased by causing compressive strain barrier layers or tensile strain barrier layers to intervene between a plurality of well layers of the multilayer quantum well structure. As a result, the carrier concentration in each well is made uniform and the efficiency of recombination in the wells is improved and the increase of a threshold current is curbed.

Further, in the quantum well structure which has undergone modulation doping in the n type, when the barrier layers are so distorted as to induce generation of an electric field in the direction of from the opposite sides of a barrier layer to the interior thereof, the potential at the center of each barrier layer is increased and the electrons excited from the impurity present at the center are allowed to fall easily into the well. As a result, the number of electrons in the quantum well is increased and the magnitude of a threshold current is decreased and the characteristics of the modulation doping are utilized amply. By the same token, in the quantum well structure which has undergone modulation doping in the p type, when the barrier layers are so distorted as to induce generation of an electric field in the direction of from the interior of a barrier layer to the exterior thereof, the potential in each barrier layer is decreased and the positive holes emitted from the impurity present at the center are allowed to fall easily into the well.

In cases where either the electrons or the positive holes are exclusively desired to be prevented from overflowing in the quantum well structure, this particular prevention is attained by causing only those of a plurality of barrier layers which exist on the side toward which the electrons or the positive holes are moved to be distorted and enabling these barrier layers to generate therein an electric field in the direction of movement of the electrons or the positive holes.

In cases where the confinement of positive holes in a system having a small band offset on the valence band side is desired to be improved, the wells on the valence band side are enabled to occur in the clefts of potential of strain barriers by reversing the tensile strain barriers disposed for the purpose of improving the confinement of electrons into compressive strain barriers or by reversing the A plane of the orientation of the {111} substrate to the B plane orientation.

BRIEF DESCRIPTION OF THE DRAWINGS

FIG. 6A is a cross section of an opto-semiconductor device as a first embodiment of this invention provided with tensile strain barrier layers and compressive strain barrier layers;

FIG. 6B is an energy band diagram of the element shown in FIG. 6A;

FIG. 7A is a cross section of an opto-semiconductor device as a second embodiment of this invention provided with tensile strain barrier layers and compressive strain barrier layers which have undergone modulation doping;

FIG. 7B is an energy band diagram of the element shown in FIG. 7A;

FIG. 8A is a cross section of an opto-semiconductor device as a third embodiment of this invention provided with compressive strain barrier layers;

FIG. 8B is an energy band diagram of the element shown in FIG. 8A;

FIG. 9A is a cross section of an opto-semiconductor device as a fourth embodiment of this invention provided with tensile strain barrier layers; and FIG. 9B is an energy band diagram of the element shown in FIG. 9A.

DETAILED DESCRIPTION OF THE PREFERRED EMBODIMENTS

Now, embodiments of this invention will be described below with reference to the annexed drawings.

Figure 3A:
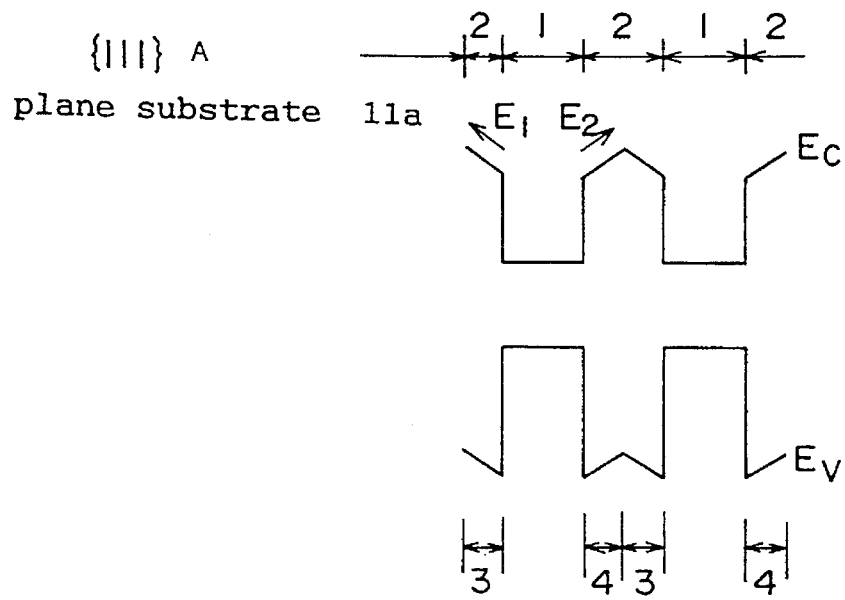
FIG. 3A is an energy band diagram illustrating a first example of a quantum well structure provided with a strain barrier layer associated with an opto-semiconductor device of this invention.

Preparatorily to the description of the embodiments, the principle of this invention will be explained. The semiconductor laser according to this invention has a quantum well structure of such an energy band as is shown in FIG. 3A formed on the {111} A plane of a compound semiconductor substrate, for example. In this quantum well structure, of barrier layers 2 which sandwich each well layer 1, those which fall on the substrate side have a tensile strain layer barrier 3 formed therein and those which fall on the other side have a compressive strain barrier layer 4 formed therein. The well layers 1 severally contact tensile strain barrier layers 3 on the substrate side and compressive strain barrier layers 4 on the other side. As a result, each barrier layer 2 sandwiched between two well layers 1 is possessed of a tensile strain barrier layer 3 and a compressive strain barrier layer 4.

Figure 3B:
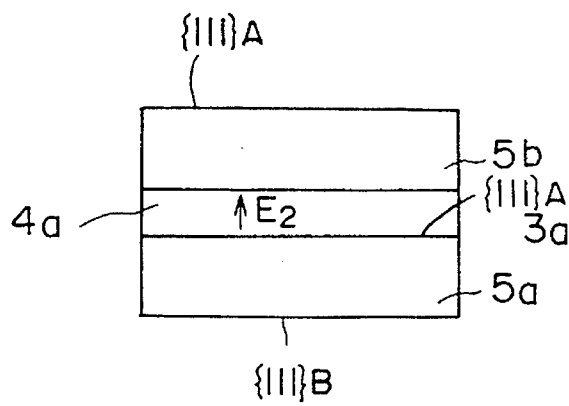
FIG. 3B is a diagram illustrating the direction of an electric field generated by a piezoelectric effect in a compressive strain layer formed on the {111} A substrate of a semiconductor layer.
Figure 3C:
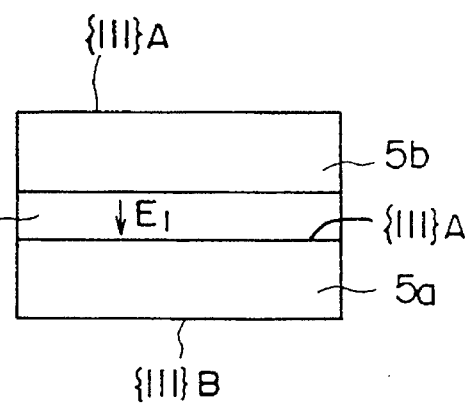
FIG. 3C is a diagram illustrating the direction of an electric field generated by a piezoelectric effect in a tensile strain layer formed on the {111} A plane of a semiconductor layer.

These tensile strain barrier layers 3 and compressive strain barrier layers 4 are possessed of a zincblende structure crystal and oriented parallel to the {111} substrate thereof. The tensile strain barrier layers 3 formed on the {111} A plane substrate have an electric field $E_1$ generated therein in the direction of the substrate. The band ends $E_c$ and $E_v$ of these tensile strain barrier layers 3, therefore, are so inclined as to lose in height in proportion as the distance from the substrate increases. The compressive strain barrier layers 4 formed on the {111} B plane of the relevant well layers 1 opposite to the substrate side have an electric field $E_2$ generated therein in the direction away from the well layers 1 adjoining the compressive strain barrier layers 4. The band ends $E_c$ and $E_v$ of the compressive strain barrier layers 4, therefore, are so inclined as to gain in height in proportion as the distance from the substrate increases. This is because, in a system having a compressive strain layer 4a and a semiconductor layer 5b formed on the {111} A plane of a substrate 5a possessed of a zincblende crystal structure as of a group III–V or a group II–VI while causing the crystal to grow in a positive direction perpendicular to the {111} A plane as shown in FIG. 3B, the compressive strain layer 4a generates therein the electric field $E_2$ in the positive direction of from the substrate 5a to the semiconductor layer 5b. When a tensile strain layer 3a and the semiconductor layer 5b are formed on the {111} A plane of the substrate 5a as shown in FIG. 3C instead, the tensile strain layer 3a generates therein the electric field $E_1$ in the negative direction of from the semiconductor layer 5b to the substrate 5a. These electric fields $E_1$ and $E_2$ are generated by the piezoelectric effect. In the case of a group III–V compound semiconductor, the {111} A plane thereof is formed of a group III element and the [111] B plane a V group element.

Figure 4A:
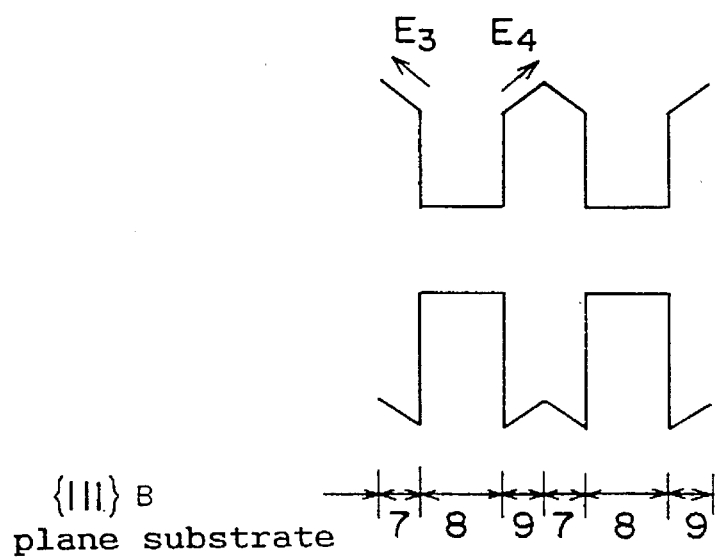
FIG. 4A is an energy band diagram illustrating a second example of a quantum well structure provided with a strain barrier layer associated with an opto-semiconductor layer of this invention.

When a quantum well structure is formed by sequentially superposing a compressive strain barrier layer 7, a well layer 8, and a tensile strain barrier layer 9 repeatedly in the order mentioned on the {111} B plane of a compound semiconductor substrate, there is obtained such an energy band as shown in FIG. 4A. The shape of this band is the same as shown in FIG. 3A.

Figure 4B:
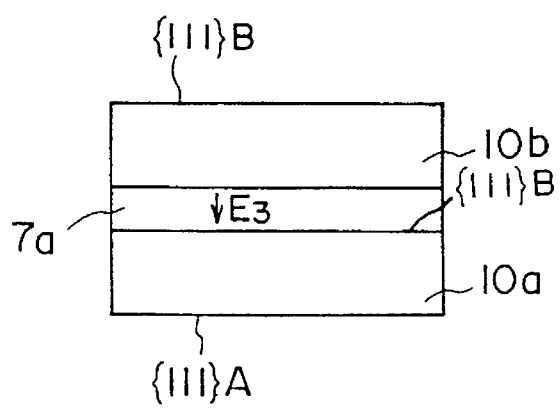
FIG. 4B is a diagram illustrating the direction of an electric field generated by a piezoelectric effect in a compressive strain layer formed on the {111} B plane of a semiconductor layer.
Figure 4C:
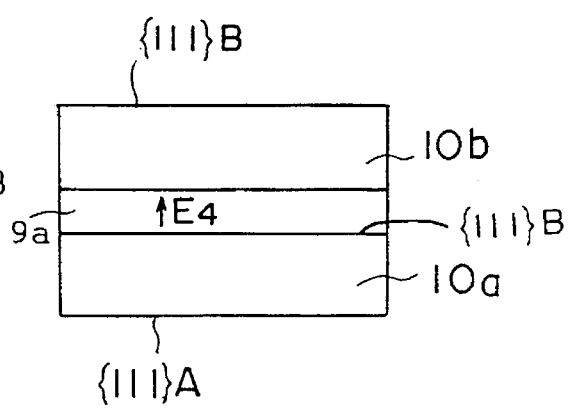
FIG. 4C is a diagram illustrating the direction of an electric field generated by a piezoelectric effect in a tensile strain layer formed on the {111} B plane of a semiconductor layer.

In this structure, of the barrier layers sandwiching each well layer 8, those falling on the substrate side are compressive strain barrier layers and those on the opposite side are tensile strain barrier layers 9. This is because, in a system having a compressive strain layer 7a and a semiconductor layer 10b formed on the {111} B plane of a substrate 10a possessed of a zincblende crystal structure as of a III–V or a II–VI group while causing the crystal to grow in a positive direction perpendicular to the {111} B plane as shown in FIG. 4B, the compressive strain layer 7a generates therein the electric field $E_3$ in the negative direction of from the semiconductor layer 10b to the substrate 10a to the semiconductor layer 5b. When a tensile strain layer 9a and the semiconductor layer 10b are formed on the {111} B plane of the semiconductor substrate 10a as shown in FIG. 4C instead, the tensile strain layer 9a generates therein an electric field $E_4$ in the positive direction of from the {111} B plane substrate 10a to the semiconductor layer 10b.

Since this invention causes wells to occur on the bottoms of clefts to be formed by two adjacent barriers, the wells on the conduction band side have great depth as compared with those which are produced when no strain barrier layer is formed.

Incidentally, the compressive strain barrier layers and the tensile strain barrier layers are severally made of materials which allow no lattice matching with the compound semiconductor substrate and formed in a thickness not exceeding the critical film thickness. When a layer having a different lattice constant from first and second semiconductor layers is formed between the first and the second semiconductor layer as described above, the interposed layer automatically constitutes a strain layer. The selection of the lattice constant is attained by selecting the material to be used for the strain layer and the percentage composition of this material. The discrimination between the compressive strain and the tensile strain is effected by either increasing or decreasing the lattice constant of the strain layer relative to the lattice constant of the substrate. If the strain layer has an unduly large thickness, no lattice matching will be attained between the strain layer and the substrate and the grown layer will entail impairment of crystallinity. Thus, the strain layer must possess a thickness not exceeding the critical film thickness.

In the quantum well structure described above, the parts of the barrier layers which approximate the well layers are under the influence of an electric field generated by their own crystal strain in the direction of from the well layers to the barrier layers. Because of this electric field, the electrons are prevented from overflowing the SCH layers on the p type cladding layer side and the positive holes from overflowing the SCH layers on the n type cladding layer side. As a result, the increase of the threshold current is curbed because the electrons are prevented from overflowing the SCH layers on the p type cladding layer side and then recombining themselves with the positive holes in the barrier areas or the positive holes are prevented from overflowing the SCH layers on the n type cladding layer side and then recombining themselves with the electrons in the barrier areas.

In cases where either the electrons or the positive holes are exclusively desired to be prevented from the overflowing, the desire is satisfied simply by conferring strain on and inducing generation of an electric field in those of the plurality of barrier layers which fall on the p type cladding layer side or the n type cladding layer side.

Figure 5A:
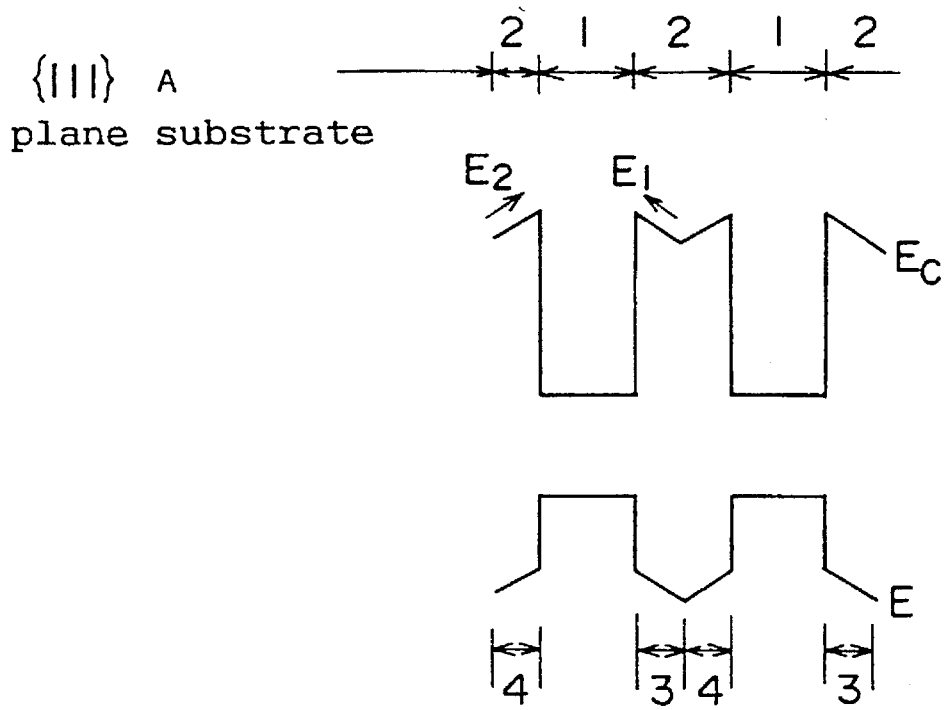
FIG. 5A is an energy band diagram illustrating a third example of a quantum well structure provided with a strain barrier layer associated with an opto-semiconductor device of this invention.
Figure 5B:
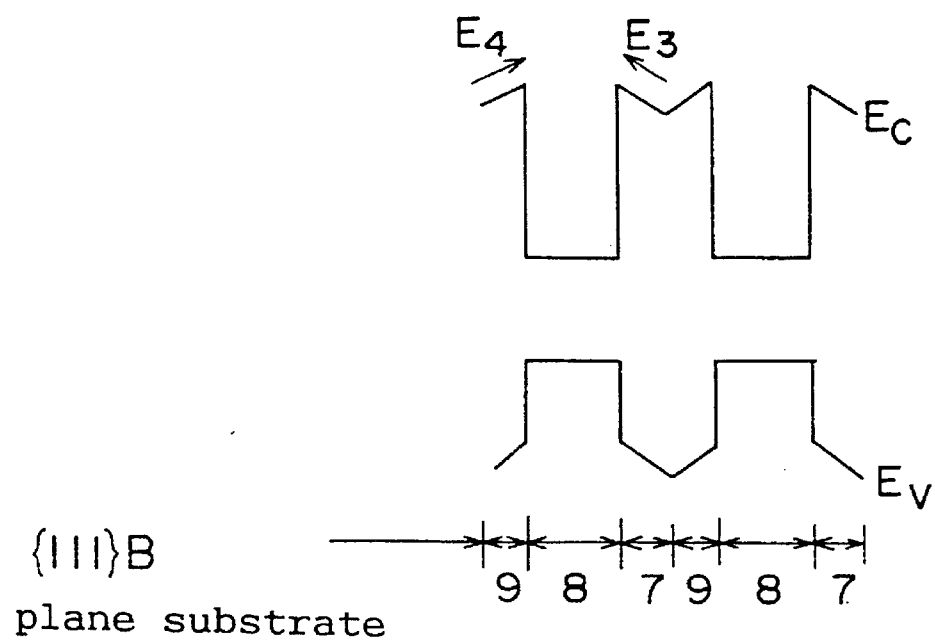
FIG. 5B is an energy band diagram illustrating a fourth example of a quantum well structure provided with a strain barrier layer associated with an opto-semiconductor device of this invention.

Then, in cases where the confinement of positive holes in a system having a small band offset on the valence band side is desired to be improved, the wells on the valency band side are enabled to occur in the clefts of two adjacent strain barriers as shown in FIGS. 5A and 5B by interchanging the tensile strain barriers and the compressive strain barriers mentioned above or reversing the plane orientation of the substrate, namely the {111} A plane or the {111} B plane.

It is permissible to adopt a modulation doped quantum well structure for the purpose of lowering the oscillation threshold or expediting the modulation.

For the piezoelectric effect to be advantageously generated in the strain layers, it is thought necessary to form a quantum well structure on a plane inclined in the direction of from the {111} plane to the {110} plane by an angle exceeding 0 degrees and falling within ±35.5 degrees, a plane inclined in the direction of from the {111} plane to the {100} plane by an angle exceeding 0 degrees and falling within ±54.7, preferably ±19.5 degrees, or a plane inclined in the direction of from the {111} plane to the {110} plane by an angle exceeding 0 degrees and falling within ±35.3 degrees and also inclined in the direction of from the {111} plane to the {100} plane by an angle exceeding 0 degrees and falling within ±54.7, preferably ±19.5 degrees. The {111} plane mentioned in the preceding sentence refers to either the {111} A plane or the {111} B plane.

Generally, where an internal electric field is generated and the carrier concentration is high, there exists the possibility that the electric field will be screened by the carriers. In the case of the strain barrier layers mentioned above, however, they are affected adversely only sparingly by the screening because they have a small carrier concentration as compared with the active layers.

Incidentally, the strain causes a change in the positions of the conduction band and the valence band and gives rise to a point of discontinuity in the interplanes between the strain barrier layers and the strainless well layers. Since this fact has no special influence to bear on the effect of this invention, this particular point will be omitted from further description. It has been known incidentally that when a crystal of some sort is caused to distort in a specific direction, an electric field is generated in the crystal owing to the piezoelectric effect. When a strain layer is formed in the {111} plane of a compound semiconductor crystal of a zincblende structure, an electric field is generated in the crystal by the piezoelectric effect. The technique relevant to this phenomenon is reported in the literature identified below. The application of the strain layers of this sort to the barrier layers of the quantum well structure, however, is mentioned nowhere in this literature. [1] D. L. Smith: Solid State Communications, Vol. 57, No. 12, pp 919–921, 1986

Generally, the crystal planes are known in a plurality of crystallographically equivalent forms. For the purpose of representation in the description of this invention, a plurality of crystallographically equivalent crystal planes are expressed collectively by the symbol "{ }." For example, the (111) plane, the ($1\bar{1}\cdot\bar{1}$) plane, the ($\bar{1}\cdot1\bar{1}$) plane, and the ($\bar{1}\cdot\bar{1}\cdot1$) plane are crystallographically equivalent and they are collectively referred to as the {111} plane. The {111} A plane and the {111} B plane are similarly general terms.

Now, the structure of the semiconductor laser which is based on the principle explained above will be specifically described below.

First Embodiment

FIGS. 6A and 6B are respectively a cross section of a semiconductor laser as a first embodiment of this invention and a potential energy band diagram thereof.

With reference to FIG. 6A, an n type cladding layer 12, a first SCH layer 13, an active layer 14 of a multilayer quantum well structure, a second SCH layer 15, a p type cladding layer 16, and a p$^+$ type contact layer 17 are sequentially formed in the order mentioned on the {111} A plane of a semiconductor substrate 11 containing an n type impurity.

In the multilayer quantum well structure, of barrier layers 20 alternately sandwiching a plurality of well layers 19, tensile strain barrier layers 21 are formed in those falling on the substrate side and compressive strain barrier layers 22 in those falling on the opposite side. Thus, the well layers 19 contact the tensile strain barrier layers 21 on the substrate side and the compressive strain barrier layers 22 on the opposite side. As a result, each barrier layer 20 which is formed between adjacent well layers 19 is possessed of a tensile strain barrier layer 21 and a compressive strain barrier layer 22. The well layers 19, the tensile strain barrier layers 21, and the compressive strain barrier layers 22 are severally formed three each and the tensile strain barrier layers 21 and the compressive strain barrier layers 22 sandwiched by the well layers 19 are joined mutually.

The upper part of the p type cladding layer 16 and the p$^+$ type contact layer 17 are each formed in the shape of a stripe laid along the direction of guiding waves and these layers are covered with an SiO$_2$ film 23. A p type electrode 18 is connected to the upper side of the contact layer 17 through an opening formed in the SiO$_2$ film 23 and an n type electrode 24 is formed on the lower side of the semiconductor substrate 11.

Now, concrete examples of the material of which the semiconductor laser described above is formed and of the thicknesses of the component layers thereof will be described below. The semiconductor substrate 11 is formed of InP which contains silicon as an n type impurity at a concentration in the range of from $1\times10^{18}$ to $2\times10^{18}$/cm$^{-3}$. The n type InP cladding layer 12 which contains silicon at the same impurity concentration as the compound semiconductor substrate 11 is formed in a thickness of several μm. The p type InP cladding layer 16 which contains zinc at an impurity concentration in the range of from $1\times10^{18}$ to $2\times10^{18}$/cm$^{-3}$ is formed in a thickness of 3 μm. The two SCH layers 13 and 15 are formed of non-doped $In_{0.71}Ga_{0.29}As_{0.62}P_{0.38}$ and have a thickness of 30 nm. The well layer 19 of a multilayer quantum well structure is formed of a non-doped strainless $In_{0.53}Ga_{0.47}As$ in a thickness of 10 nm. The tensile strain barrier layer 21 which adjoins the well layer 19 on the substrate side is formed of non-doped $In_{0.63}Ga_{0.37}As_{0.64}P_{0.36}$ in a thickness of 5 nm. The compressive strain barrier layer 22 which adjoins the well layer 19 on the p type cladding layer 16 side is formed of a non-doped $In_{0.79}Ga_{0.21}As_{0.59}P_{0.41}$ in a thickness of 5 nm. Then, the contact layer 17 is formed of $In_{0.71}Ga_{0.29}As_{0.62}P_{0.38}$ containing zinc at a concentration in the range of from $6\times10^{18}$ to $1.5\times10^{19}/cm^3$ in a thickness of 1 μm. The p type electrode is formed of Ti/Pt/Au and the n type electrode is formed of (AuGe/Au).

Those of the component layers of the semiconductor layer mentioned above up to the p type cladding layer on the semiconductor substrate 11 are continuously grown as by the MOVPE method. The contact layer 17 is grown as by the MOVPE method or the LPE method. It is preferably grown continuously from the underlying cladding layer 16. By the ordinary etching method using a mask, the contact layer 17 and the cladding layer 16 are removed except for a thickness of 0.5 μm of the cladding layer 16.

In the semiconductor laser of the present embodiment, the n type cladding layer 12 through the p type cladding layer 16 has such an energy band as shown in FIG. 6B.

In this construction, the tensile strain barrier layer 21 formed on the {111} A plane generates therein an electric field in the direction of the substrate. The band ends Ec and Ev of the tensile strain barrier layer 21 are so inclined as to lose in height in proportion as the distance from the substrate increases. In contrast, the compressive strain barrier layer 22 generates an electric field therein in the direction departing from the well layer 19 which adjoins the compressive strain. The band ends Ec and Ev of this compressive strain barrier layer 22 are so inclined as to gain in height in proportion as the distance from the substrate increases.

Since wells are caused to occur on the clefts formed between two adjacent barriers, therefore, the wells on the conduction band end side consequently have a large depth as compared with the barrier layers endowed with no strain and the electrons are prevented from overflowing the SCH layer 15 on the p type cladding layer 16 side and then recombining themselves with positive holes in the barrier area. As a result, the confinement of electrons is improved and the threshold current is decreased.

A desire to prevent the positive holes from overflowing the SCH layer on the n type cladding layer side is satisfied by reversing the relative disposition of the compressive strain barrier layers and the tensile strain barrier layers. As a result, on the valence band end, wells are caused to occur on the clefts between two adjacent barriers and the positive holes are precluded from overflowing the SCH layer on the n type cladding layer side and the threshold current is prevented from increasing.

Second Embodiment

FIGS. 7A and 7B are respectively a cross section of a semiconductor laser as a second embodiment of this invention and a potential energy band diagram thereof.

With reference to FIG. 7A, an n type cladding layer 12, a first SCH layer 13, an active layer 23 of a multilayer quantum well structure, a second SCH layer 15, a p type cladding layer 16, and a p$^+$ type contact layer 17 are sequentially formed in the order mentioned on the {111} A plane of a semiconductor substrate 11 containing an n type impurity.

The multilayer quantum well structure in this embodiment is identical with that of the first embodiment excepting it has undergone modulation doping.

The upper part of the p type cladding layer 16 and the p$^+$ type contact layer 17 are each formed in the shape of a stripe laid along the direction of guiding waves and these layers are covered with a $SiO_2$ film 13. A p type electrode 18 is connected to the upper side of the contact layer 17 through an opening formed in the $SiO_2$ film 13 and an n type electrode 24 is formed on the lower side of the semiconductor substrate 11.

Now, concrete examples of the material of which the semiconductor laser described above is formed and of the thicknesses of the component layers thereof will be described below. The materials used, the thicknesses, and the methods of growth used for the semiconductor substrate 11, the cladding layers 12 and 16, and the contact layer 17 are identical to those of the first embodiment and, therefore, will be omitted from the following description.

In the multilayer quantum well structure, the well layer 24 is formed of a strainless non-doped $In_{0.53}Ga_{0.47}As$ in a thickness of 10 nm. A tensile strain barrier layer 26 which adjoins the well layer 24 on the substrate side is formed of an n type $In_{0.63}Ga_{0.37}As_{0.64}P_{0.36}$ in a thickness of 5 nm and a compressive strain barrier layer 27 which adjoins the well layer 24 on the p type cladding layer 16 is formed of an n type $In_{0.79}Ga_{0.21}As_{0.59}P_{0.41}$ in a thickness of 5 nm. In the tensile strain barrier layer 26 and the compressive strain barrier layer 27 have impurity concentrations in the range of from $1\times10^{18}/cm^3$ to $2\times10^{18}/cm^3$.

In the present embodiment, the n type cladding layer 12 to the p type cladding layer 16 have such an energy band diagram as shown in FIG. 7B.

In this structure, the tensile strain barrier layer 26 formed on the {111} A plane generates an electric field in the direction of the substrate. The band ends Ec and Ev of the tensile strain barrier layer 26 are so inclined as to lose in height in proportion as the distance from the substrate increases. The compressive strain barrier layer 27 generates an electric field therein in the direction departing from the well layer 24 which adjoins the compressive strain barrier layer 27. The band ends Ec and Ev of the compressive strain barrier layer 27 are so inclined as to gain in height in proportion as the distance from the substrate increases.

Since wells are caused to occur on the clefts formed between two adjacent barriers, therefore, the wells on the conduction band end side consequently have a large depth as compared with the barrier layers endowed with no strain and the electrons are prevented from overflowing the SCH layer 15 on the p type cladding layer 16 side and recombining themselves with positive holes in the barrier area. As a result, the confinement of electrons is improved and the threshold current is decreased.

The carriers excited from the impurity existing in the areas of the tensile strain barrier layer 26 and the compressive strain barrier layer 27 close to the well layer 24 fall into the well layer 24 and get confined therein to give rise to space charge. In this case, though the centers of the barrier layers are lowered under the influence of the space charge as compared with those in the first embodiment, the center of a barrier layer 25 is enlarged as pointed at the conduction band end Ec because the barrier layer 25 is endowed with strain as described above.

In the present embodiment, therefore, the number of carriers which fall into the wells is larger than usual because the carriers excited from the impurity existent in the part of the barrier layer 25 separated from the well layer 24 are moved to the well layer 24 by the electric field generated by the strain.

Further, since the wells are formed on the clefts between the tensile strain barriers and the compressive strain barriers, the wells on the conduction band ends have a large depth similarly to those in the first embodiment. As a result, the electrons are prevented from overflowing the SCH layer 15 on the p type cladding layer 16 side and precluded from recombining themselves with the positive holes in the barrier area.

The fact that the number of carriers which fall into the well layers is increased results in decreasing the threshold current from the usual band and further the fact that the overflow of carriers from the wells is curbed and consequently the threshold current is decreased from the usual band further improves the effect of the modulation doping.

In cases where the p type modulation doping has been carried out, it is only necessary to reverse the relative disposition of the compressive strain barrier layers and the tensile strain barrier layers. Since the wells are caused to occur on the clefts of barriers at the valence bond end, the number of the positive holes which fall into the wells is increased similarly to that in the case of the second embodiment.

Third Embodiment

FIGS. 8A and 8B are respectively a cross section of a semiconductor laser as a third embodiment of this invention and a potential energy band diagram thereof.

With reference to FIG. 8A, an n type cladding layer 12, a first SCH layer 13, an active layer 28 of a multilayer quantum well structure, a second SCH layer 15, a p type cladding layer 16, and a p$^+$ type contact layer 17 are sequentially formed in the order mentioned on the {111} A plane of a semiconductor substrate 11 containing an n type impurity.

The multilayer quantum well structure has three well layers 29 and compressive strain barrier layers 30 are formed one each between the first well layer 29 close to the semiconductor substrate 11 and the first SCH layer 13 and between the third well layer 29 and the second SCH layer 15. Separation barrier layers 31 each nipped between two adjacent well layers 29 are formed of a material which has no lattice strain relative to the semiconductor substrate 11.

The upper part of the p type cladding layer 16 and the p$^+$ type contact layer 17 are each formed in the shape of a stripe laid along the direction of guiding waves and these layers are covered with a SiO$_2$ film 13. A p type electrode 18 is connected to the upper side of the contact layer 17 through an opening formed in the SiO$_2$ film 13 and an n type electrode 24 is formed on the lower side of the semiconductor substrate 11.

Now, concrete examples of the materials and the film thicknesses to be used for the component layers of the semiconductor layer herein will be described below.

In the semiconductor laser of the present embodiment, the semiconductor substrate 11, the cladding layers 12 and 16, the SCH layers 13 and 15, etc. other than the multilayer quantum well structure are made of the same materials as used in First Embodiment in the same thicknesses as shown in First Embodiment. The semiconductor layers inclusive of the active layer 28 are grown by the same method as used in First Embodiment.

In the multilayer quantum well structure, the well layers 29 are formed of strainless non-doped $In_{0.53}Ga_{0.47}As$ in a thickness of 10 nm. The strainless separation barrier layers 31 which are sandwiched between the adjacent well layers 29 are formed of a non-doped $In_{0.71}Ga_{0.29}As_{0.62}P_{0.38}$ and the compressive strain barrier layer 30 which adjoin the SCH layers 13 and 15 are formed of a non-doped $In_{0.79}Ga_{0.21}As_{0.59}P_{0.41}$ in a thickness of 5 nm.

Figure 1A:
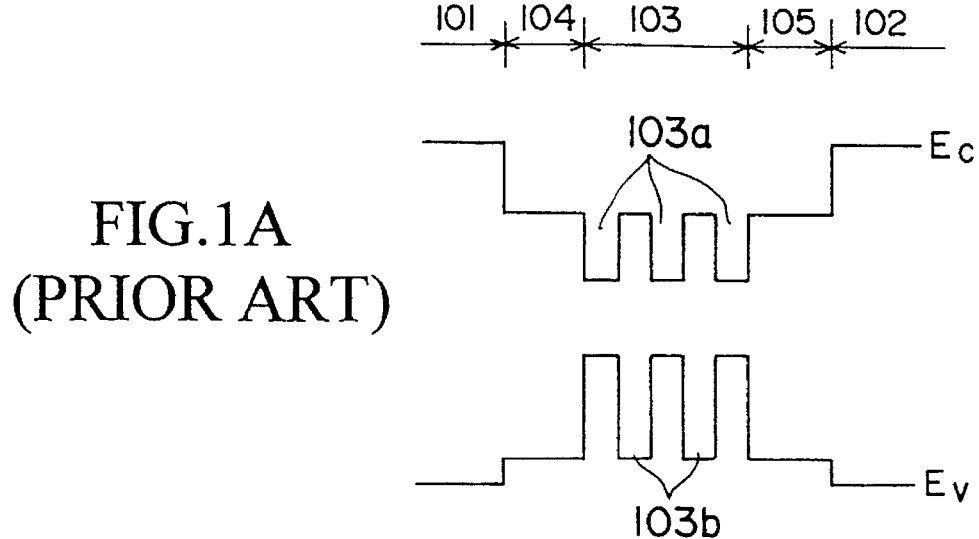
FIG. 1A is an energy band diagram of a conventional multilayer quantum well structure provided with SCH layers.
Figure 1B:
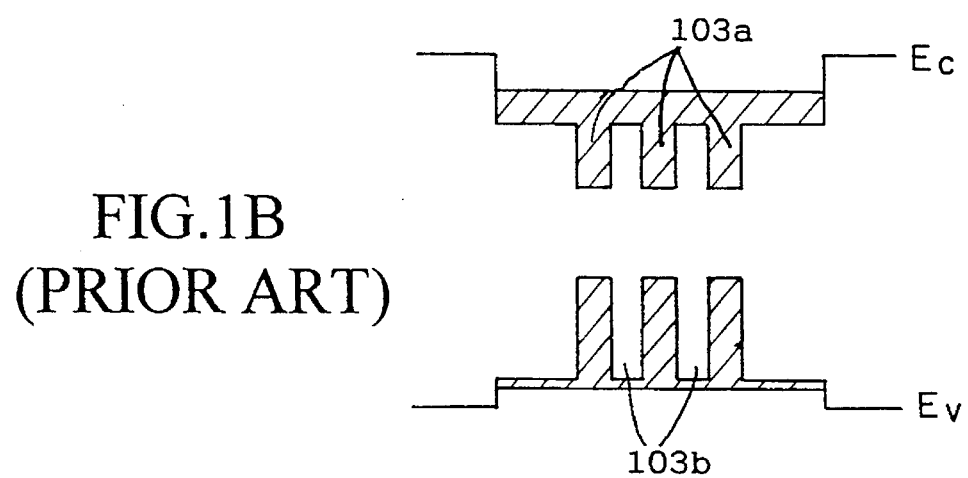
FIG. 1B is an energy band diagram illustrating a state in which carriers are overflowing from the quantum wells shown in FIG. 1A.
Figure 1C:
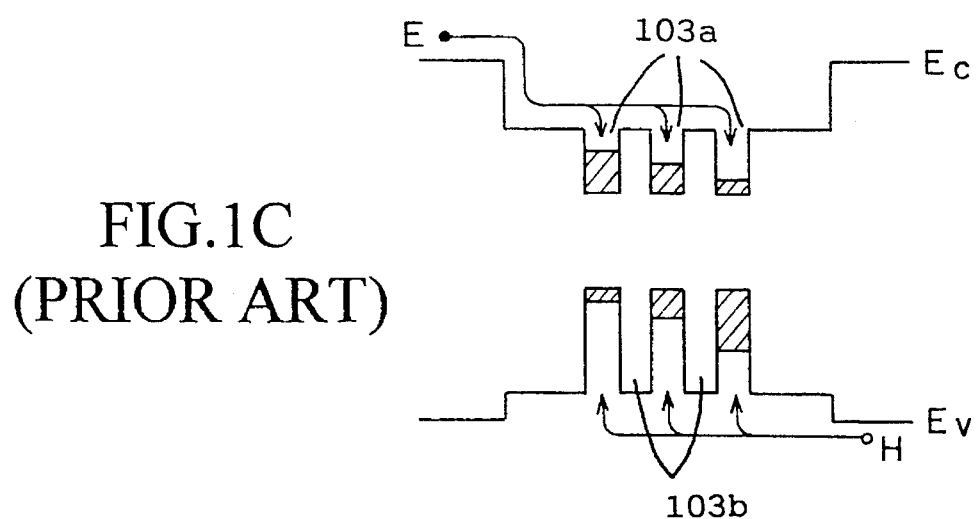
FIG. 1C is an energy band diagram illustrating a state in which carriers are being injected into the quantum wells shown in FIG. 1A.
Figure 2:
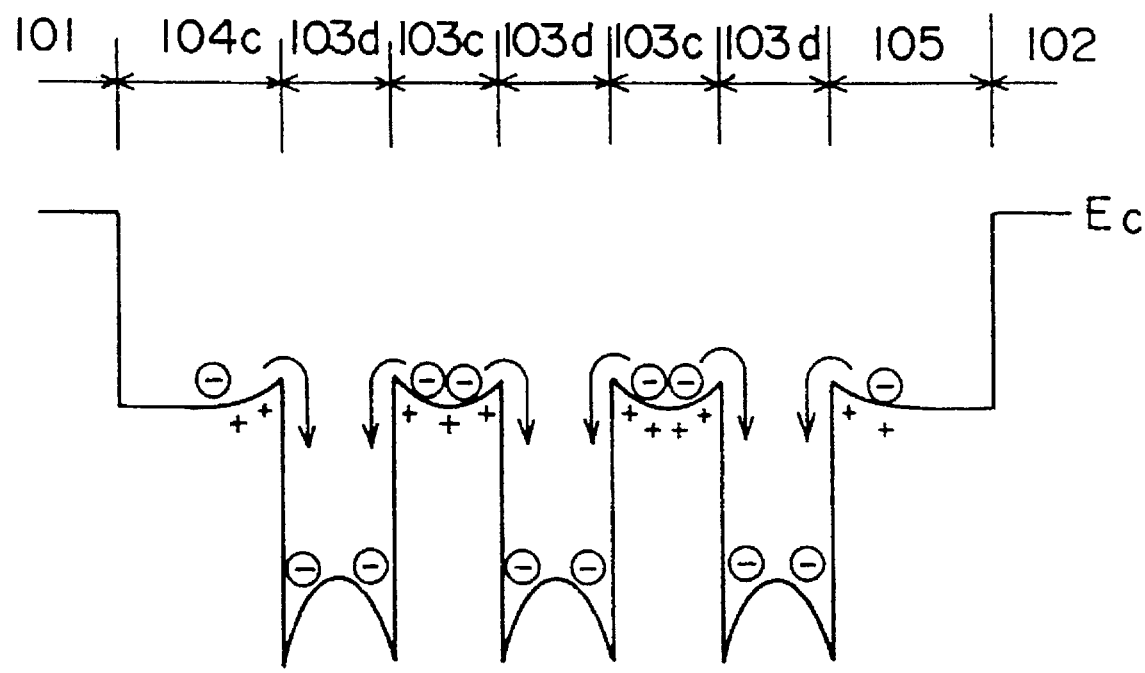
FIG. 2 is a diagram illustrating a conduction band in the energy band of a multilayer quantum well structure which has undergone modulation doping.

In the present embodiment, the n type cladding layer 12 to the p type cladding layer 16 have such an energy band diagram as shown in FIG. 8B. In this structure, the compressive strain barrier layers 30 which adjoin the two SCH layers 13 and 15 generate an electric field therein in the direction of from the n type cladding layer 12 to the p type cladding layer 16. In the present embodiment, therefore, the second SCH layer 15 has a large height as compared with that of the conventional semiconductor laser (FIG. 2) which has no strain in the barrier layers formed on the opposite sides of the quantum well structure and the first SCH layer 13 has a small height as compared with the conventional semiconductor laser which has no strain in the barrier layers.

As a result, the probability of the electrons recombining themselves with the positive holes in the second SCH layer 15 is lessened because the electrons injected from the n type cladding layer 12 into the well layer 29 do not readily overflow this SCH layer 15. Likewise, the positive holes which are injected from the p type cladding layer 16 into the well layer 29 do not readily overflow the first SCH layer 13.

Owing to these factors, the possible rise of the threshold current is precluded.

A desire to prevent exclusively the overflow of electrons in the multilayer quantum well structure is satisfied by conferring compressive strain exclusively on the barrier layer which adjoin the second SCH layer 15. Conversely, a desire to prevent exclusively the overflow of positive holes therein is fulfilled by conferring compressive strain exclusively on the barrier layer which adjoins the first SCH layer 13.

Fourth Embodiment

FIGS. 9A and 9B are respectively a cross section of a semiconductor laser as a fourth embodiment of this invention and a potential energy band diagram thereof.

With reference to FIG. 9A, an n type cladding layer 12, a first SCH layer 13, an active layer 32 of a multilayer quantum well structure, a second SCH layer 15, a p type cladding layer 16, and a p$^+$ type contact layer 17 are sequentially formed in the order mentioned on the {111} A plane of a semiconductor substrate 11 containing an n type impurity.

The multilayer quantum well structure has three well layers 34 joined through the medium of two intervening tensile strain barrier layers 33. The two outermost well layers 34 directly contact the SCH layers 13 and 15.

The upper part of the p type cladding layer 16 and the p$^+$ type contact layer 17 are each formed in the shape of a stripe laid along the direction of guiding waves and these layers are covered with an SiO$_2$ film 13. A p type electrode 18 is connected to the upper side of the contact layer 17 through an opening formed in the SiO$_2$ film 13 and an n type electrode 24 is formed on the lower side of the semiconductor substrate 11.

Now, concrete examples of the materials and the film thicknesses to be used for the component layers of the semiconductor layer herein will be described below.

In the semiconductor laser of the present embodiment, the semiconductor substrate 11, the cladding layers 12 and 16, the SCH layers 13 and 15, etc. other than the multilayer quantum well structure are made of the same materials as used in First Embodiment in the same thicknesses as shown in First Embodiment. The semiconductor layers inclusive of the active layer 28 are grown by the same method as used in First Embodiment.

In the multilayer quantum well structure, the well layers 34 are formed of a strainless non-doped $In_{0.53}Ga_{0.47}As$ in a thickness of 10 nm. The tensile strain barrier layers 33 which are sandwiched between adjacent well layers 34 are formed of a non-doped $In_{0.63}Ga_{0.37}As_{0.64}P_{0.36}$ in a thickness of 5 nm.

In the present embodiment, the n type cladding layer 12 to the p type cladding layer 16 have such an energy band diagram as shown in FIG. 9B.

In this structure, the tensile strain barrier layers 33 which are sandwiched by the well layers 34 generate an electric field therein in the direction of from the p type cladding layer 16 to the n type cladding layer 15 and the second SCH layer 15 has a lower energy than the first SCH layer 13. As a result, the electrons which are injected from the n type cladding layer 12 are also injected copiously into the well layer 34C far from the N type cladding layer 12 and close to the second SCH layer 15 and the numbers of electrons in the individual well layers 34a to 34c are equalized. The positive holes which are supplied by thermal excitation to the well layers 34 are rendered by an electric field generated by crystal strain readily movable in the direction of the well layer 34a close to the n type cladding layer 12, with the result that the densities of positive holes in the individual well layers 34 will be equalized.

According to the present embodiment, therefore, the efficiency of recombination in the well layers 34 is exalted and the rise of the threshold current is repressed as compared with the conventional semiconductor laser which has no strain in the barrier layers sandwiched by the well layers.

Other Embodiments

In the embodiments cited above, the cladding layers, the SCH layers, the multilayer quantum well structure, and other layers are depicted as formed on the {111} A plane of the semiconductor substrate. Optionally, they may be formed on the {111} B plane instead. In cases where these semiconductor layers are formed on the {111} B plane, however, a desire to obtain such an energy band structure as shown in FIGS. 6B, 7B, and 8B is fulfilled by changing the term "compressive strain barrier layers" used in the preceding description to read as "tensile strain barrier layers" and the term "tensile strain barrier layers" to read as "compressive strain barrier layers." Since the reason for this alteration has been already described above with respect to the principle of this invention, it will be omitted herein.

Silicon has been cited hereinabove as a concrete example of the n type impurity for the group III–V semiconductor. Sulfur, tin, and tellurium are other concrete examples. Zinc has been cited hereinabove as a concrete example of the p type impurity of the group III–V semiconductor. Beryllium, germanium, cadmium, manganese, and magnesium are other concrete examples.

Further, in the first and the second embodiments mentioned above, the barrier layers sandwiched by the well layers are depicted as being formed of tensile strain barrier layers and compressive strain barrier layers. Optionally, strainless barrier layers may be interposed between the tensile strain barrier layers and the compressive strain barrier layers. The interposition of these strainless barrier layers precludes the otherwise possible collapse of crystal lattices of the individual semiconductor layers superposed on the semiconductor substrate even when the lattice constants of the tensile strain barrier layers and those of the compressive strain barrier layers are widely different.

The semiconductor laser described above is intended to oscillate a laser beam by a forward bias. Optionally, it may be adapted for a light modulating device by a reverse bias. In this case, the active layer functions as a light absorbing layer.

It is also permissible to form a semiconductor light amplifying device in the same structure as the semiconductor laser mentioned above. In the light amplifying device, the light amplification is generally attained by attaching a film adapted to decrease the reflectance to each of the opposite end planes of laser, supplying an electric current smaller than the threshold current to the light amplifying device, and injecting a light ray into one end of the active layer while the device is kept in the energized state.

The tensile strain barrier layers and the compressive strain barrier layers contemplated by this invention may be adopted in light switches, light filters, and other opto-semiconductor devices which are possessed of a quantum well structure.

In the quantum well structure of these opto-semiconductor devices, strain well layers may be formed in conjunction with strain barrier layers.

What is claimed is:

1. An opto-semiconductor device having a quantum well structure, said quantum well structure comprising:

barrier layers provided at least in part thereof with a strain layer enabled to generate an internal electric field by a piezoelectric effect; and a well layer.

2. The opto-semiconductor device according to claim 1, wherein said strain layer is formed of a group III–V compound semiconductor crystal of a zincblende structure grown perpendicularly to a {111} plane of a compound semiconductor substrate.

3. The opto-semiconductor device according to claim 1, wherein said quantum well structure is formed on an InP substrate.

4. The opto-semiconductor device according to claim 3, wherein said strain layer is formed of InGaAsP attaining no lattice matching with said InP substrate and said well layer is formed of InGaAs attaining lattice matching with said InP substrate.

5. The opto-semiconductor device according to claim 1, wherein said strain layer has a thickness of not more than a critical film thickness.

6. The opto-semiconductor device according to claim 1, wherein said strain layer is formed on a plane inclined in the direction of from a {111} plane to a {110} plane by an angle exceeding 0 degrees and falling within ±35.5 degrees.

7. The opto-semiconductor device according to claim 1, wherein said strain layer is formed on a plane inclined in the direction of from a {111} plane to a {100} plane by an angle exceeding 0 degrees and falling within ±19.5 degrees.

8. The opto-semiconductor device according to claim 1, wherein said strain layer is formed on a plane inclined in the direction of from a {111} plane to a {110} plane by an angle exceeding 0 degrees and falling within ±35.3 degrees and in the direction of from a {111} plane to a {100} plane by an angle exceeding 0 degrees and falling within ±54.7 degrees.

9. The opto-semiconductor device according to claim 1, wherein said well layer is sandwiched by said strain layers of said barrier layers and said internal electric fields in said two strain layers are generated in the direction of from the interior to the exterior of each of said well layer.

10. The opto-semiconductor device according to claim 1, wherein said well layers are sandwiched by said strain layers of said barrier layers and said internal electric fields in said two strain layers are respectively generated in the direction of from the exterior to the interior of each of said well layers.

11. The opto-semiconductor device according to claim 1, wherein said quantum well structure is formed between an n type semiconductor layer and a p type semiconductor layer and said internal electric field is generated in the direction of from said n type semiconductor layer to said p type semiconductor layer.

12. The opto-semiconductor device according to claim 1, wherein said quantum well structure is formed between an n type semiconductor layer and a p type semiconductor layer and said internal electric field is generated in the direction of from said p type semiconductor layer to said n type semiconductor layer.

13. The opto-semiconductor device according to claim 1, wherein said quantum well structure has undergone modulation doping.

14. An opto-semiconductor device having a quantum well structure, said quantum well structure comprising:

a tensile strain barrier layer formed on a {111} A plane of a group III–V compound semiconductor;

a well layer formed on said tensile strain barrier layer; and a compressive strain barrier layer formed on said well layer.

15. An opto-semiconductor device having a quantum well structure, said quantum well structure comprising:

a compressive strain barrier layer formed on a {111} B plane of a group III–V compound semiconductor, a well layer formed on said compressive strain barrier layer; and a tensile strain barrier layer formed on said well layer.

16. An opto-semiconductor device having a quantum well structure, said quantum well structure comprising:

a compressive strain barrier layer formed on a {111} A plane of a group III–V compound semiconductor;

a well layer formed on said compressive strain barrier layer, and;

a tensile strain barrier layer formed on said well layer.

17. An opto-semiconductor device having a quantum well structure, said quantum well structure comprising:

a tensile strain barrier layer formed on a {111} B plane of a group III–V compound semiconductor;

a well layer formed on said tensile strain barrier layer, and;

a compressive strain barrier layer formed on said well layer.

* * * * *